United States Patent
Aitouarab (10) Patent No.: US 6,646,468 B2
(45) Date of Patent: Nov. 11, 2003

(54) SWITCHING DEVICE WITH HIGH-VOLTAGE TRANSLATOR

(75) Inventor: Leïla Aitouarab, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/073,680

(22) Filed: Feb. 11, 2002

(65) Prior Publication Data

US 2002/0145446 A1 Oct. 10, 2002

(30) Foreign Application Priority Data

Feb. 12, 2001 (FR) .............................. 01 01885

(51) Int. Cl.[7] ..................... H03K 19/0175; G11C 7/00
(52) U.S. Cl. ..................... 326/81; 365/189.11
(58) Field of Search ..................... 326/63, 68, 80, 326/81; 365/189.11; 327/333

(56) References Cited

U.S. PATENT DOCUMENTS

| | | | |
|---|---|---|---|
| 5,510,731 A | 4/1996 | Dingwall | 326/63 |
| 5,600,592 A * | 2/1997 | Atsumi et al. | 365/185.18 |
| 5,751,643 A | 5/1998 | Lines | 365/189.11 |
| 6,370,071 B1 * | 4/2002 | Lall et al. | 365/205 |

FOREIGN PATENT DOCUMENTS

GB  2201059  8/1988  .......... H03K/17/10

* cited by examiner

Primary Examiner—Daniel D. Chang
(74) Attorney, Agent, or Firm—Lisa K. Jorgenson; Allen, Dyer, Doppelt, Milbrath & Gilchrist, P.A.

(57) ABSTRACT

A voltage-switching device includes a high-voltage translator connected to a high-voltage node receiving either a low-voltage logic level or a high-voltage level as a function of a low-voltage/high-voltage mode control signal to provide at least one output signal as a function of this mode control signal and of a switching control signal. A voltage-level switching circuit is controlled by output signals from the high-voltage translator and by the mode control signal and the switching control signal for application, as output voltage levels, of either ground or the low-voltage logic level in low-voltage mode or the high-voltage level in high-voltage mode.

35 Claims, 5 Drawing Sheets

SWITCHING DEVICE WITH HIGH-VOLTAGE TRANSLATOR

FIELD OF THE INVENTION

The present invention relates to integrated circuits, and more particularly, to a voltage-switching device of the type using a high-voltage translator.

BACKGROUND OF THE INVENTION

Voltage-switching devices are used especially in non-volatile memory integrated circuits to apply the appropriate voltage levels to the memory cells as a function of the operation to be performed. In these applications, different levels of low voltage and high voltage are applied to perform various read and write (programming, erasure) operations.

In integrated circuits using low voltage technologies, the electronic elements cannot withstand excessively high voltages. In particular, the oxides are highly vulnerable. In a practical example, with transistors having double oxide thicknesses, these transistors cannot withstand more than five volts of a gate-source voltage, a gate-drain voltage or a source-drain voltage. Especially in non-volatile memory applications, high voltages are applied for write operations, and the oxides of certain transistors are subjected to voltages far above five volts.

Figure 1:
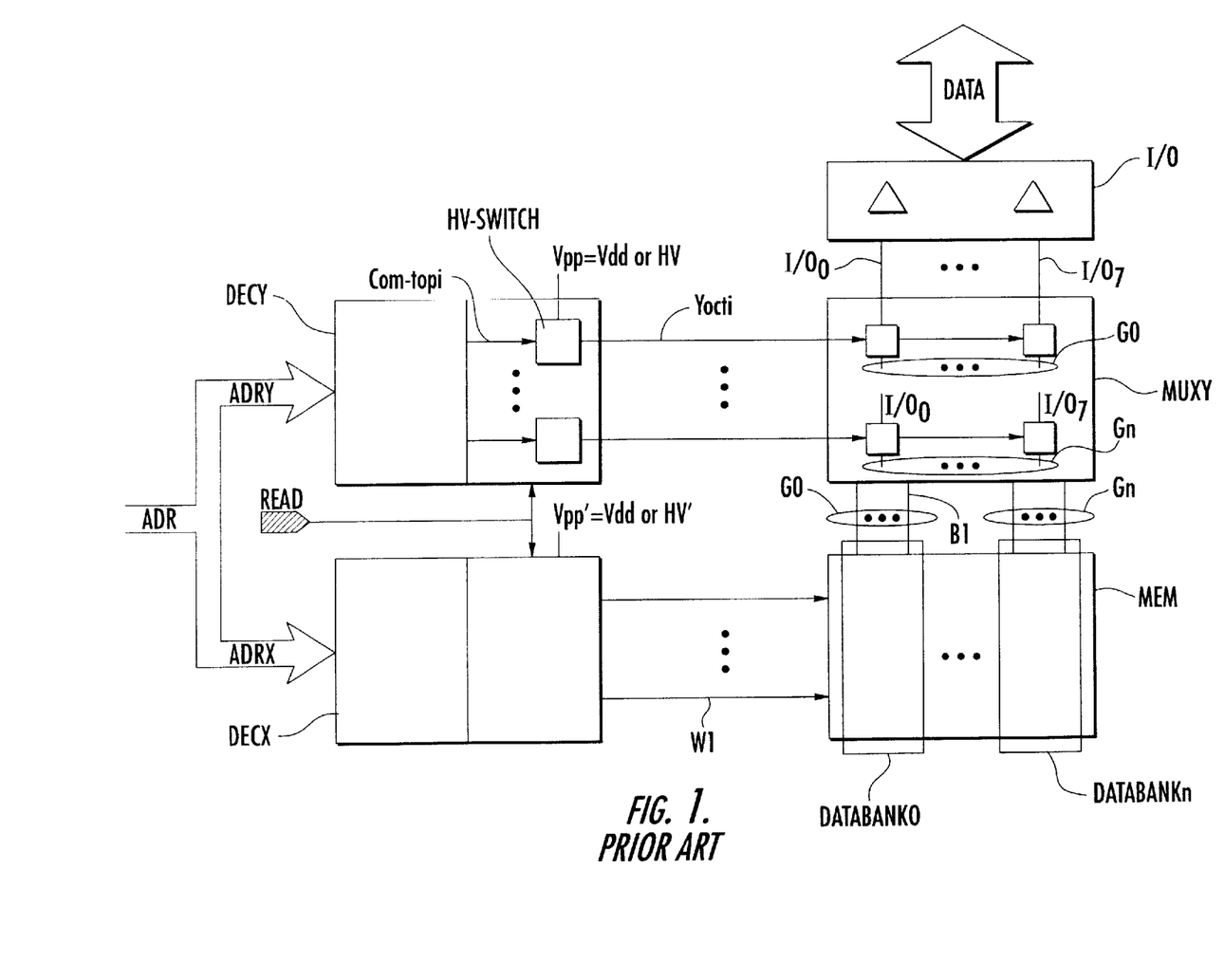
FIG. 1 is a general block diagram of a memory architecture with the associated decoding and input/output (read/write) circuits according to the prior art.

As illustrated schematically in FIG. 1, memories are commonly organized in matrix form, in bit lines B1 and word lines W1. Each bit line B1 connects the drains of the memory cells in one column and each word line W1 connects the gates of the memory cells in one row.

There are various architectures in existence. In particular, the bit lines may be grouped by databanks DATABANK0–DATABANKn enabling simultaneous access to several memory cells in one databank located on the same row. In these architectures, the selection of a memory address comprises the selection of a corresponding word row or line and of the bit lines of the corresponding bank.

This address selection is carried out by decoding circuits. These decoding circuits are used for the selection of the memory cells or cells corresponding to a memory address presented at input, by applying appropriate voltage levels to these cells as a function of the requested operation. As illustrated in FIG. 1, there is a column address decoding circuit DECY and a row address decoding circuit DECX.

The invention relates more particularly to the column address decoding circuits DECY. The row decoding circuit DECX outputs low-voltage or high-voltage levels for each row. These levels are directly applied to the gates of the cells of the memory. The row-decoding circuit has a translator type circuit having an adapted structure, especially a cascode-stage structure, to provide the desired voltage levels.

However, the column-decoding circuit, for its part, gives a low-voltage (0, Vdd) or a high-voltage (0, HV) logic control signal that is applied to one or more switching transistors of a multiplexer circuit MUXY which connects the I/O read/write circuits to the bit lines B1 of the memory. In programming (or erasure), a switching transistor may have a high-voltage applied to its drain (or source) by the write circuits, while its gate has a high-voltage logic signal applied to it. This signal may be either at 0 or at the high-voltage level. In one case, the switching transistor is off. In the other case, it is on and its drain (or source) level is transmitted to a bit line of the memory.

In an integrated circuit made in low-voltage technology, these switching transistors are particularly vulnerable. The column address decoding circuit DECY comprises a decoding circuit that gives low-voltage (0, Vdd) logic address selection signals Com-topi as a function of the column address ADRY that is applied to it, and a memory control signal READ whose level 0 or 1 indicates a write or read operation.

Each address selection signal Com-top is applied to a high-voltage translator type circuit HV-Switch, whose output Yocti is used to control one or more gates of the multiplexer circuit MUXY placed between the bit lines B1 of the memory and the read/write I/O circuits. Each output signal Yocti has a voltage level that depends on the associated selected signal Com-topi, and on the operation to be performed in the memory, namely on the memory control signal READ.

The multiplexer circuit MUXY is usually based on a gate structure enabling the connection of a read or write circuit to a selected bit line of the memory. Each gate is controlled by one of the signals Yocti given by the column address decoding circuit. In the exemplary structure shown in FIG. 1, the multiplexer MUXY has one set of gates per group of bit lines G0–Gn corresponding to a databank DATABANK0–DATABANKn. Each set of gates is controlled by a corresponding selection signal Yocti. In this example, there is one output signal Yocti per set of gates of the multiplexer, namely per databank of the memory.

The number of gates controlled by one output selection signal Yocti, as well as the number of gates to control a bit line, depend on the memory architecture and the number of decoding levels of the address decoding circuit. FIG. 1 shows one possible structure among others. In the prior art, the gates of the multiplexer are usually NMOS transistors. For a read operation, these are low-voltage logic signals. They typically take the level of ground 0V in the case of non-selection (with NMOS transistor off), and the level of the logic supply voltage Vdd (or a lower level), for example 2.5 volts, in the case of selection (with NMOS transistor on).

For a write operation, these are high-voltage logic signals. They typically take the level of ground 0V in the case of non-selection (with the NMOS transistor off), and a high-voltage level, for example 12 volts, in the case of selection (with the NMOS transistor on) enabling a high-voltage level in the range of 7.5 volts to be made to go from its drain to its source. In integrated circuits using low-voltage technology, it has been noted that these switching transistors are fragile because of the voltage levels that may be applied to them in the writing mode. For these reasons, other gate structures that are more stress-resistant are used.

The invention is concerned with a data structure using complementary MOS transistors in which the NMOS transistor is the active transistor in read mode, and the PMOS transistor is the active transistor in write mode. These transistors then receive a complementary control signal at their gates.

The PMOS transistor has the advantage over the NMOS transistor of switching the high-voltage without losses. To turn it off, the high-voltage must be applied to its gate. To turn it on, and switch the high-voltage applied to its source to its drain without losses, it is enough to apply a voltage level to it that is lower than a little more than a transistor threshold with respect to the high-voltage.

In the invention, it is proposed, in write mode, to apply the voltage level Vdd instead of the 0 voltage level to the gate of the PMOS transistor, or in general, a low-voltage logic level such that the difference between the high-voltage level and the level applied to the gate remains smaller than or equal to the borderline voltage acceptable across the oxide.

Thus, by using the low-voltage high logic level, Vdd in the example, a desired control is achieved over the PMOS transistor, and this is achieved without stress. The parallel-connected NMOS transistor, controlled at its gate by a signal complementary to that of the PMOS transistor, experiences equivalent voltage levels. This transistor is also without stress.

This problem of controlling high-voltage switching transistors may also occur, depending on the architecture, in the write circuits, for application of the high-voltage upline from the multiplexer (assuming that the bit lines are downline) as a function of the data element 0 or 1 applied to the input of the write circuits to switch the high-voltage level Vpp=HV or the low-voltage logic level Vdd to the source of the PMOS transistor. Thus, a general problem of the invention pertains to the control of switching MOS transistors in integrated circuits made in low-voltage technology.

In the exemplary generation of appropriate voltage levels for the control Yoct of the gate of a PMOS transistor that is active in write mode and /Yoct for the control of an NMOS transistor that is active in read mode, assuming by convention that the signal Com-top is active at 0 (selection of the associated bit line or lines), the high-voltage switching device provides the following levels as illustrated in Table 1.

TABLE 1

|  | Read | | Write | |
| --- | --- | --- | --- | --- |
|  | NMOS/ Yoct | PMOS Yoct | NMOS/ Yoct | PMOS Yoct |
| Com-top = 0 (selection) | 2.5 V | 0 V | 7.5 V | 2.5 V |
| Com-top = 1 (non-selection) | 0 V | 2.5 V | 2.5 V | 7.5 V |

There is a translation of the logic levels between the read mode and the write mode. The control of the multiplexer in write mode becomes an analog type of control. The high-voltage translator circuits of the prior art cannot be used to give a gate control signal of this type. At an output, the circuits can give only 0 and Vpp=Vdd in read mode and Vpp=HV in write mode.

SUMMARY OF THE INVENTION

An object of the present invention is to provide a device that generates voltage levels suitable for low-voltage technologies, particularly for non-volatile memory applications.

A control signal is provided with shifted or analog voltage levels as a function of a given control signal. The invention is not limited to the exemplary application given. It can be applied more generally to any circuit requiring analog voltage levels.

The invention therefore relates to a voltage-switching device comprising a high-voltage translator connected to a high-voltage node receiving either a low-voltage logic level or a high-voltage level as a function of a low voltage/high-voltage mode control signal. The translator provides at least one output signal as a function of this mode control signal and of a switching control signal.

The voltage-switching device further comprises a voltage-level switching circuit. This circuit is controlled by output signals of the high-voltage translator and by the mode and switching control signals for the application, as output voltage levels, of either ground or the low-voltage logic level in low-voltage mode or the low-voltage logic level or the high-voltage level in high-voltage mode.

The invention also relates to an integrated circuit comprising a switching device of this kind, especially an integrated circuit with non-volatile memory.

BRIEF DESCRIPTION OF THE DRAWINGS

Other features and advantages of the invention are given in the following description, that is provided by way of an indication that in no way restricts the scope of the invention and with reference to the appended drawings, of which.

DETAILED DESCRIPTION OF THE PREFERRED EMBODIMENTS

Figure 2:
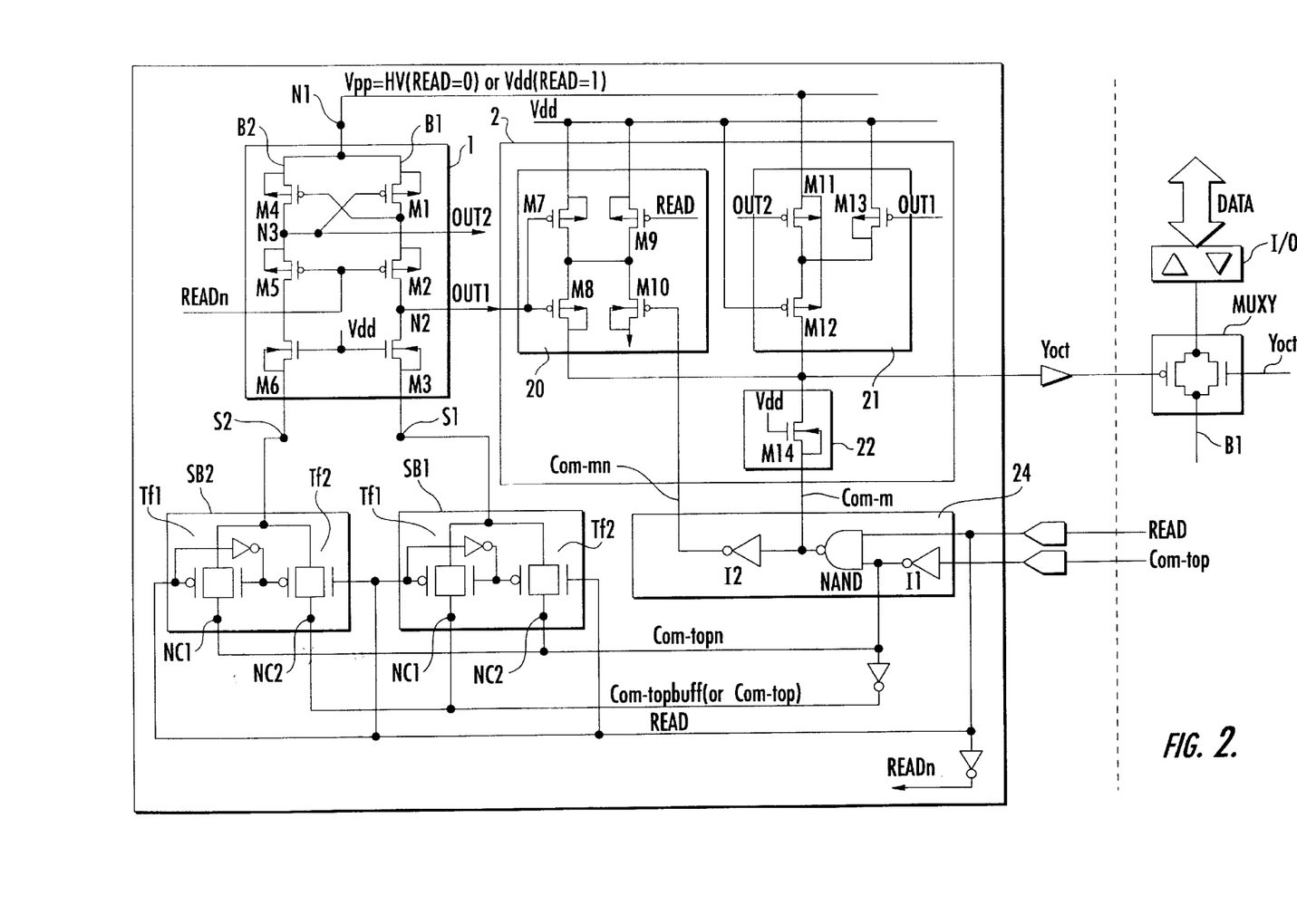
FIG. 2 is a general diagram of a device according to the invention.
Figure 3:
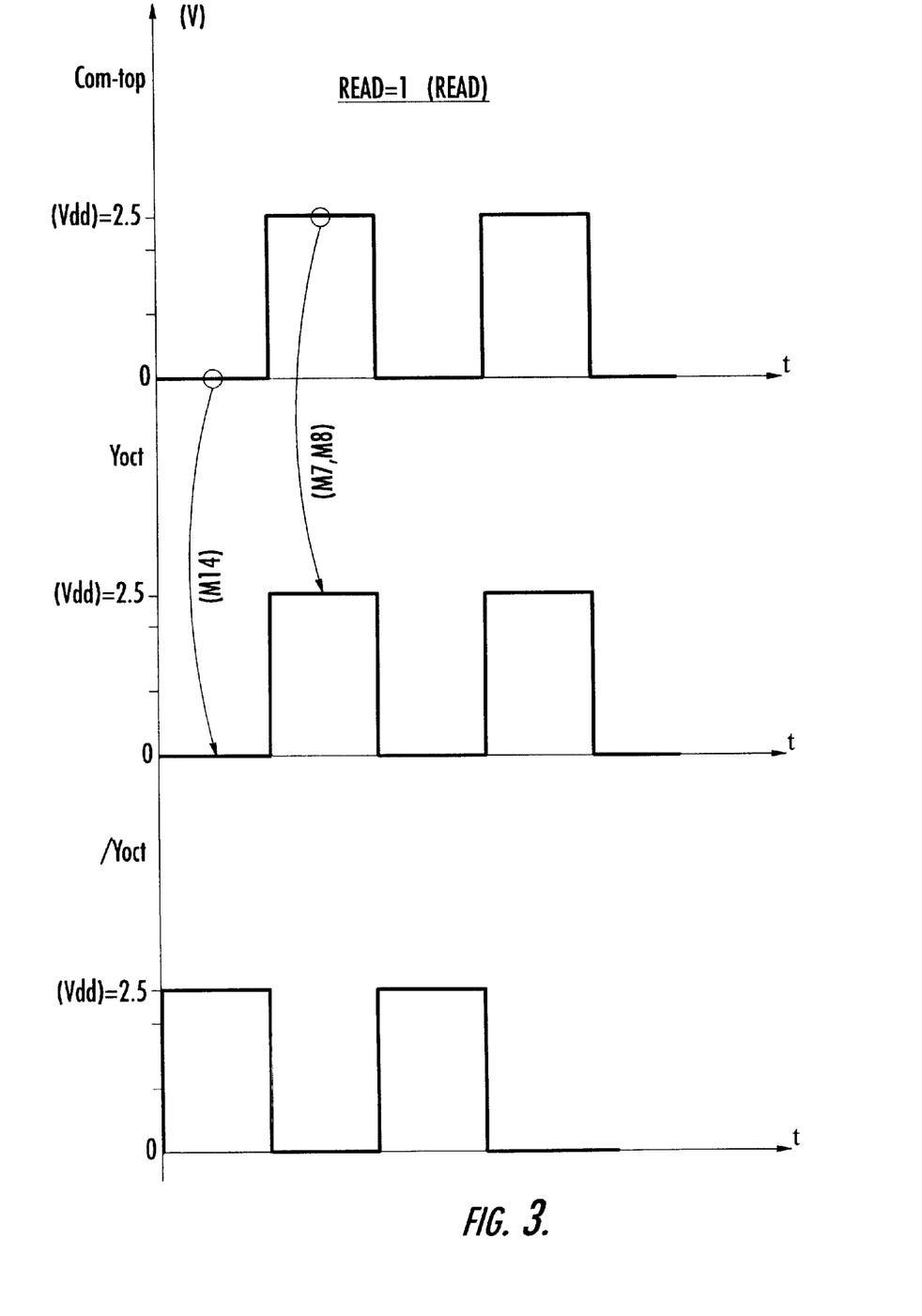
FIGS. 3 and 4 respectively show the shape of the output signal of the device according to the invention as a function of the input control for a read and write operation.
Figure 4:
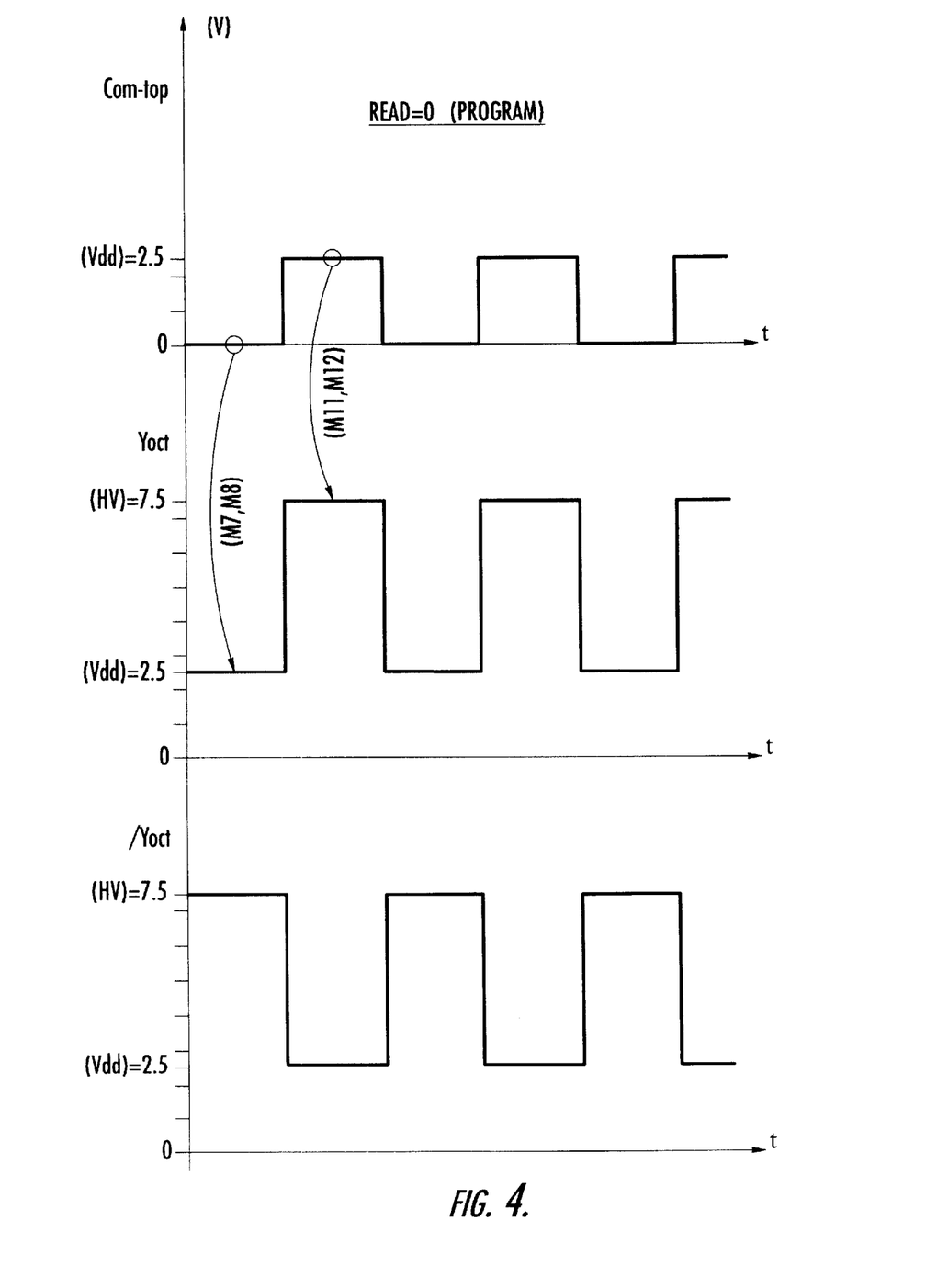

FIG. 2 is a general diagram of a high-voltage switching device according to the invention. The switching device comprises a voltage translator circuit 1 and a level switching circuit 2. This device gives an output signal Yoct as a function of two control signals that are applied to it: a low-voltage/high-voltage mode control signal READ and the switching control signal Com-top. The level obtained at the output Yoct as a function of these control signals is shown in FIGS. 3 and 4, which corresponds to Table 1. In application to a memory, the signal READ corresponds to the read (low-voltage mode)/write (high-voltage mode) control signal. The switching control signal Com-top corresponds to the address selection signal.

The voltage translator circuit 1 has a usual two-arm structure B1 and B2. The two arms are identical. Each arm is connected between a node N1 receiving a signal Vpp and a source control circuit. The signal Vpp is set at a logic level at low voltage, typically Vdd (but possibly at a level lower than Vdd depending on the technology considered) or at a high-voltage level HV generally given by a charge pump circuit internal to the integrated circuit. This control of the voltage level of the node N1 depends on the low voltage (read)/high-voltage (write) mode control signal READ. Hereinafter, the term "level of the logic supply voltage Vdd", must be taken more generally to mean the low voltage logic level which is a level smaller than or equal to Vdd, defined as a function of the technology of the integrated circuit.

The first arm B1 has a PMOS transistor M1, a cascode PMOS transistor M2 and an NMOS transistor M3, connected in series. The transistor M1 has its source connected to the node N1. In a commonly used voltage translator circuit, the source of the NMOS transistor would be connected to ground and the switching control signal would be applied to its gate.

In the low-voltage technologies, a configuration such as this is not desirable because the drain of the NMOS transistor may rise to a high voltage, creating an undesirable drain/source and drain/gate stress. In the low-voltage technologies, it is not desirable to have a drain-source voltage, a drain-gate voltage or a source-gate voltage of more than 5 volts (for a logic supply voltage that is defined at 2.5 V). Thus, in the invention, the switching control is preferably applied to the source S1 of the NMOS transistor M3, by an appropriate source control circuit SB1. The gate of the NMOS transistor M3 is taken to the logic supply voltage Vdd.

The second arm B2 is identical to the first arm B1. The transistors M1, M2 and M3 in the arm B1 have corresponding transistors M4, M5 and M6 in this arm B2. The source S2 of the MOS transistor M6 is controlled by a source control circuit SB2. The gate of the NMOS transistor M6 is taken to the logic supply voltage Vdd.

The source control circuits SB1 and SB2 are identical, but controlled in a complementary way to send the level of the second switching control signal (Com-top) or the inverse level (Com-topn) to the source node, as a function of the mode control signal (READ). The source control signal SB1 has two pass gates or buffer gates Tf1, Tf2. Each pass gate has two parallel-connected complementary MOS transistors connected between the source S1 of the arm B1 and a respective control node. The control node NC1 of the first gate Tf1 receives the switching control signal Com-top (or a corresponding signal Com-top-buff, for reasons explained below). The control node NC2 of the other pass gate Tf2 receives the inverse switching signal Com-topn.

Similarly, the gate control signal for the pass gates is the inverse signal. In the first pass gate Tf1, it is the read/write mode control signal READ that is applied to the gate of the PMOS transistor and the inverse control signal READ that is applied to the gate of the NMOS transistor. In the second pass gate Tf2, the process is inverted.

The source control circuit SB2 of the arm B2 is identical. However, the switching control signals Com-top and Com-topn are applied inversely. Thus, it is the node NC2 that receives the address switching control signal Com-top (or Com-topbuff), while the node NC1 receives the inverse switching control signal Com-topn.

Preferably, for reasons of fan-out balancing, the signal Com-topbuff is used instead of the switching control signal Com-top on the pass gate control nodes. The switching control signal Com-top, in the example, is given by a decoding circuitry. The signal Com-topn is given from the signal Com-top by an inverter. It is preferable in these conditions to apply the signal Com-top-buff also given by an inverter from the signal Com-topn. In this way, the control of these transfer gates is improved.

Operation of the source control circuits SB1 and SB2 is relatively straightforward and complementary. It depends on the operation of the mode control signal READ. In read mode, the mode control signal READ is at 1, by convention. In this case, the pass gates Tf1 of the control circuits SB1 and SB2 are off. The circuit SB1 then copies out the inverse switching control signal Com-topn on the source S1 of the arm B1 while the circuit SB2 copies out the switching control signal Com-top (or Com-top-buff) on the source S2 of the arm B2. In write mode, with READ at 0, the process is inverted. The circuit SB1 copies out the switching control signal Com-top on the source S1 of the arm B1, while the circuit SB2 copies out the inverse switching control signal Com-topn (or Com-top-buff) on the source S2 of the arm B2.

The translator circuit 1 gives two output signals OUT1 and OUT2 whose levels are a function of the mode control signal READ and the switching control signal Com-top. The node N2 between the drain of the cascode transistor M2 and the drain of the transistor M3 of the first arm gives the first output signal OUT1. The node N3 between the drain of the transistor M4 and the source of the cascode transistor M5 of the second arm gives the other output signal OUT2.

These output signals OUT1 and OUT2 are applied as control signals to the level switching circuit 2. Another control signal Com-m and its inverse signal Com-mn are given by a logic circuit 24, as a function of the mode control signal READ and the switching control signal Com-top. This logic circuit 24 comprises, in the example, an inverter I1 that receives the switching control signal Com-top and gives the inverse control signal Com-topn, and a NAND gate which receives this inverse switching control signal and the mode control signal READ as inputs. This NAND gate gives the control signal Com-m at its output. An additional inverter I2 gives the inverse signal Com-mn.

The switching circuit 2 applies the appropriate level at its output to the line Yoct, as a function of the mode control signal READ and the switching control signal Com-top. There is one circuit per level to be switched to this line. A first circuit 20 is for the switching of a low-voltage logic level Vdd in the example. A second circuit 21 is for the switching of a high-voltage level HV in the example. A third circuit 22 is for switching to ground.

The first switching circuit 20 is controlled by the signal OUT1 given by the level translator circuit 1. This circuit comprises an inverter with PMOS transistors M7 and M8, series-connected between the logic supply voltage Vdd (the high-low voltage logic level to be switched) and the output line Yoct. The gates of these transistors are connected in common and are controlled by the signal OUT1.

The first switching circuit 20 comprises a circuit for the protection of the PMOS transistors M7 and M8, especially for the latter. This protection circuit comprises a PMOS transistor M9 and an NMOS transistor M10, series-connected between the logic supply voltage Vdd and ground. The PMOS transistor M9 whose source is connected to Vdd is controlled at its gate by the mode control signal READ. The NMOS signal M10 whose source is connected to ground is controlled at its gate by the inverse control signal Com-mn given by the inverter I2 of the logic circuit 24. The connection node between the transistors M9 and M10 is connected to the connection node between the transistors M7 and M8.

The second switching circuit 21 is controlled by the signal OUT2. It comprises two PMOS transistors M11 and M12 series-connected between the node N1 receiving the signal Vpp and the output line Yoct. The transistor M11, whose source is connected to the node N1, is controlled at its gate by the signal OUT2. The transistor M12, whose drain is connected to the output line Yoct, has its gate biased at the logic supply voltage Vdd. A protection transistor M13 for the transistor M12 is to be provided. This transistor is a PMOS transistor connected between the logic power supply voltage Vdd and the source of the transistor M12.

The third switching circuit 22 is controlled by the control signal Com-m. This circuit comprises a single NMOS transistor M14, connected between the output line Yoct and the output Com-m of the logic circuit 24.

Operation of a high-voltage translator 1 device and level switching circuit 2 according to the invention depends on the mode control logic signal READ and the switching signal Com-top applied at input. In low-voltage mode (corresponding to a read operation in a memory application), we have READ=1 (by convention) and Vpp=Vdd. In the high-voltage translator 1, the transistors M5 and M2 of the translator are on. They are equivalent to a short circuit (their gate is at READn=0). They can therefore be overlooked The operation of the device according to the invention in read mode is as follows. Should the switching control signal Com-top be equal to 0 (address selection), the source S2 of the arm B2 is set at Com-top=0. The transistor M6 is on while the transistor M3 is off. The drain of the transistor M6 is therefore drawn to 0, and this is also at the output OUT2. That is, OUT2=0. Furthermore, the transistor M1 draws the drain of transistor M3 to Vpp=Vdd. The output OUT1 is therefore at Vdd.

The output OUT1 at Vdd therefore turns off the transistors M7 and M8 of the Vdd switching circuit 20. This output OUT1 also turns off the protection transistor M13 of the switching circuit 21. The transistor M9 of the switching circuit 20 is off, but the transistor M10, controlled by the reverse signal Com-mn of the signal Com-m, is on. It brings 0V to the drain of the transistor M8, thus fulfilling a protection role as shall be explained below.

The output OUT2 at 0 turns on the transistor M11 of the switching circuit 21, which therefore brings Vpp=Vdd to the source of the transistor M12 of this circuit. However, since the transistor M12 is biased at Vdd on its gate, it is off. Thus, the switching circuits 20 and 21 are deactivated. They no longer affect the level of the output line Yoct.

Only the transistor M14 of the switching circuit 22 is on. With READ at 1 and Com-top at 0, the control signal Com-m is at 0. The transistor M14, which has its gate biased at Vdd, therefore dictates the level 0 on the output line Yoct. Thus, in these conditions, READ=1 and Com-top=0, and we therefore have Yoct=0, set by the transistor M14 (FIG. 3).

When the switching control signal Com-top is at 1 (non-selection of address) the control signal Com-m goes to 1, and the transistor M14 is then off. The switching circuit 23 becomes inactive. In the high-voltage translator 1, the operation is the inverse of the above one. We therefore have the output OUT1 drawn to 0 by the transistor M6, and the output OUT2 which gets set at Vdd: OUT1=0 and OUT2=Vdd.

The transistors M7 and M8 of the level-switching circuit 20 therefore become conductive and take the output line Yoct to Vdd, while the protection transistors M9 and M10 of this circuit are both off. The transistor M11 of the switching circuit 21 is off. The transistor M13 is on taking Vdd to the source of the transistor M12 which is thereafter off. The switching circuit 21 is therefore inactive. Thus, in these conditions, with READ=1 and Com-top=1, we have Yoct=Vdd, set by the transistors M7 and M8 (FIG. 3).

In high-voltage mode (corresponding to the write mode in a memory application), we have READ=0 (by convention) and Vpp=HV. In the high-voltage translator 1, the transistors M5 and M2 are no longer equivalent to short-circuits, but fulfill a protection function, equivalent to that of cascode transistors.

Furthermore, the transistor M14 of the switching circuit 22 is always off (Com-m=1), regardless of the level of the switching control signal Com-top. In write mode, the switching signal 22 is therefore always inactive. Finally, the transistor M9 of the switching circuit 20 is on, thus fulfilling its role of protection of the transistor M8 which shall be explained further below, while the transistor M10 is off, (Com-mn at 0).

When the switching control signal Com-top is at 0 (selection), the operation is as follows. In the high-voltage translator, at the controls of the sources S1 and S2 of the arms, we have the inverse operation (control signal READ inverted) with respect to the operation in read mode. Thus, it is the transistor M6 that is off and the transistor M3 that is on. Then, the output OUT1 taken at the drains of the transistors M2 and M3 is set at 0, being drawn by the transistor M3. The output OUT2 is set at Vpp=HV, by the transistor M4.

We therefore have OUT1=0 and OUT2=Vpp=HV. The transistors M7 and M8 of the switching circuit 20 are on and take the output line Yoct to Vdd. The transistor M11 of the switching circuit 21 is off. The transistor M13 is on and takes Vdd to the drain of the transistor M11, preventing the intermediate node between the transistors M11 and M12 from being in a floating state. Consequently, the transistor M12 is off. The switching circuit 21 is therefore inactive. In these conditions, with READ=0 and Com-top=0, we have Yoct=Vdd, set by the transistors M7 and M8 (FIG. 4).

If the switching control signal Com-top is equal to 1 (non-selection), we have the following operation. In the high-voltage translator, it is the transistor M6 that comes on and the transistor M3 that is off. The output OUT2 then gets set at an intermediate level VI between 0 and Vpp=HV. This level VI depends on the ratio of the W/L geometries of the transistors M4 and M5. It is set so as to be low enough to enable the conduction of the transistor M11 of the switching circuit 21, i.e., it is typically VI lower then or equal to HV−2*Vtp (where Vtp is a PMOS transistor threshold).

The output OUT1 is set at the level Vpp=HV. We therefore have OUT2=VI and OUT1=HV. The transistors M7 and M8 of the switching circuit 20 are off. This circuit is therefore inactive. The transistor M9 is on, imposing Vdd on the source of the transistor M8.

The transistor M11 of the switching circuit 21 is on and takes the level Vpp=HV to the source of the transistor M12, and the transistor M13 is off. Thus, the output line Yoct is taken to Vpp=HV by this circuit 21. Thus, with REA=0 and Com-top=1, we have Yoct=Vpp=HV, set by the transistors M11 and M12 (FIG. 4).

The transistor M9 of the switching circuit 20 is used to protect the transistor M8 when the line Yoct is taken to Vpp=HV (in write mode, in the case of non-selection), in setting its source at Vdd. Thus, the transistor M8 does not undergo any excessively great differences in potential across its terminals.

The transistor M10 is a protection role when the operation is in the read mode (READ=1) and when the line Yoct is taken to 0V. It can be seen in FIG. 2, that the substrate of transistor M8 is connected to this output line Yoct. This biasing of the substrate is necessary to prevent a leakage of current through the drain-substrate diode of the transistor M8 (which is what would happen if the substrate of the transistor M8 were to be biased at Vdd).

In read mode, when the line Yoct is at 0, if there were no transistor M10, the transistor M8 would leak through the diode formed by its N substrate and P source. The transistor M10 prevents this by enforcing 0V on the source of the transistor M8.

The transistor M13 is a protection transistor of the transistor M11 of the switching circuit 21, when the operation is in write mode and when the line Yoct is taken to Vdd. It then dictates the low-voltage Vdd logic level on the drain of the transistor M11 whose source is at Vpp=HV. This transistor therefore does not undergo any excessively great potential differences across its terminals.

Figure 5:
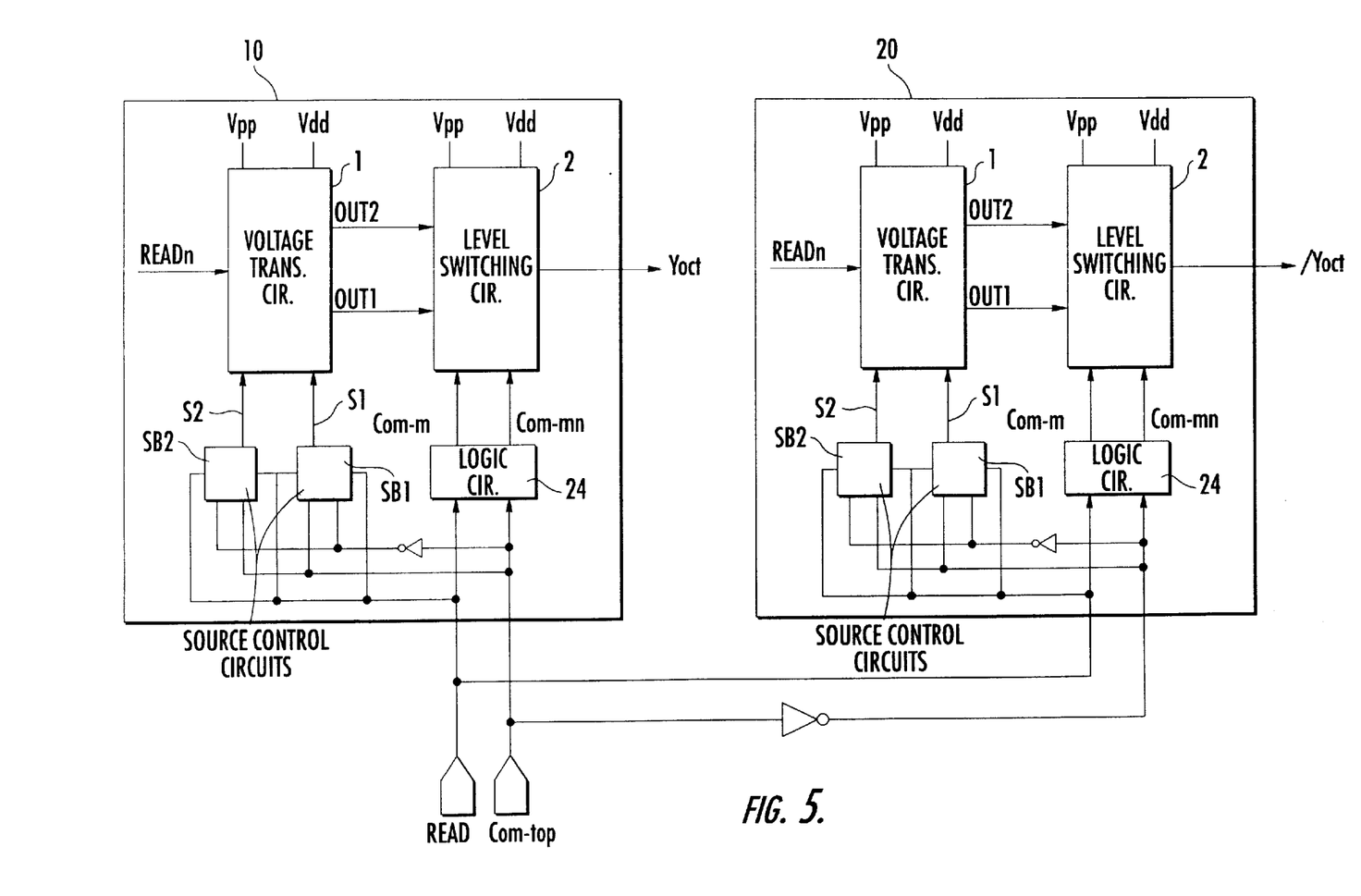
FIG. 5 is a general diagram of two switching devices according to the invention with a complementary command to control a logic gate with PMOS and NMOS complementary transistors.

With the high-voltage switching device using a high-voltage translator and level-switching circuits according to the invention it is possible to control one or more MOS transistors without any stress. By duplicating the switching device, it is possible to control a gate with NMOS and PMOS complementary transistors, by applying the complementary switching control signal. This is shown in FIG. 5.

In this figure, a switching device 10 according to the invention, controlled by the mode control signal READ and the switching control signal Com-top, gives the output signal Yoct applied as the gate control signal of a PMOS transistor. A switching device 20 according to the invention, identical to the device 10 but controlled by the mode control signal READ and the complementary switching control signal Com-topn, gives an output signal /Yoct applied as a gate control signal for an NMOS transistor.

In application to a non-volatile memory, the NMOS and PMOS transistors are parallel-connected and form a switching gate of the multiplexer circuit MUXY (FIG. 1). The switching control signal then corresponds to the selection signal given by the address decoding circuit of the column decoder DECY. Depending on whether it is the read (or low-voltage) mode or the write (or high-voltage) mode, the signals shown in FIGS. 3 and 4 are obtained as control signals Yoct and /Yoct as a function of the signal Com-top.

The invention can be applied especially in the context of non-volatile memory integrated circuits. The invention can be applied more generally in all cases where different voltage levels have to be switched by switching MOS transistors, especially in integrated circuits using low-voltage technology.

That which is claimed is:

1. A voltage-switching device comprising:
   a high-voltage translator circuit connected to a high-voltage node receiving either a low-voltage logic level or a high-voltage level as a function of a low-voltage/high-voltage mode control signal, the high-voltage translator providing at least one output signal as a function of the low-voltage/high-voltage mode control signal and a switching control signal; and
   a voltage-level switching circuit connected to said high-voltage translator circuit and being controlled by the at least one output signal, the low-voltage/high-voltage mode control signal and the switching control signal for providing, as an output voltage level, ground or the low-voltage logic level for the low-voltage mode, and the high-voltage level for the high-voltage mode.

2. A voltage-switching device according to claim 1, wherein said high-voltage translator circuit comprises two switching arms, each switching arm being connected between the high-voltage node and a respective source node; and further comprising a respective control circuit associated with each source node for providing the switching control signal or an inverse thereof as a function of the low-voltage/high-voltage mode control signal.

3. A voltage-switching device according to claim 2, wherein the at least one output signal from said high-voltage translator circuit includes a first output signal provided by one of the switching arms, and a second output signal provided by the other switching arm.

4. A voltage-switching device according to claim 1, wherein said voltage-level switching circuit comprises a respective switching circuit portion for each output voltage level to be switched.

5. A voltage-switching device according to claim 4, further comprising a logic circuit for receiving the low-voltage/high-voltage mode control signal, and the switching control signal or an inverse thereof; and wherein said respective switching circuit portion comprises a first switching circuit portion comprising an NMOS transistor connected between an output line providing the output voltage level, and an output of said logic circuit for switching the output line to ground.

6. A voltage-switching device according to claim 4, wherein the at least one output signal from said high-voltage translator circuit includes a first output signal; wherein said respective switching circuit portion comprises a second switching circuit portion comprising first and second PMOS transistors series-connected between the low-voltage logic level and an output line providing the output voltage level; and wherein each of said first and second PMOS transistors comprises a gate connected in common and being controlled by the first output signal for switching the low-voltage logic level to the output line.

7. A voltage-switching device according to claim 4, further comprising a logic circuit for receiving the low-voltage/high-voltage mode control signal, and the switching control signal or an inverse thereof; wherein said second switching circuit portion further comprises a pair of protection transistors; and wherein said pair of protection transistors comprises a third PMOS transistor and a first NMOS transistor series-connected between the low voltage logic level and ground, said third PMOS transistor comprising a gate being controlled by the low-voltage/high-voltage mode control signal, and said first NMOS transistor comprising a gate being controlled by an output of said logic circuit.

8. A voltage-switching device according to claim 4, wherein the at least one output signal from said high-voltage translator circuit includes a first and a second output signal; wherein said respective switching circuit portion comprises a third switching circuit portion comprising first and second PMOS transistors series-connected between the high-voltage node and an output line providing the output voltage level; and wherein said first PMOS transistor comprises a gate being controlled by the second output signal, and said second PMOS transistor comprising a gate being biased by the low-voltage logic level.

9. A voltage-switching device according to claim 8, wherein said third switching circuit portion comprises a third PMOS transistor connected between the low-voltage logic level and a connection point between said first and second PMOS transistors; and wherein said third PMOS transistor comprises a gate being controlled by the first output signal.

10. A voltage-switching device according to claim 1, wherein the output voltage level from said voltage-level switching circuit is for controlling a gate of a MOS transistor to be connected thereto.

11. A voltage-switching device according to claim 1, wherein the low-voltage logic level is less than or equal to 2.5 volts.

12. A non-volatile memory comprising:
   a matrix of memory cells organized in rows and columns;
   a plurality of bit lines connected to the columns of said matrix of memory cells;
   a plurality of word lines connected to the rows of said matrix of memory cells;
   a read/write circuit;
   a plurality of switching transistors connected between said read/write circuit and said plurality of bit lines; and
   a column address decoder connected to said plurality of switching transistors for providing a plurality of switching signals thereto, and comprising
      an address decoding circuit for providing a plurality of bit line address selection signals, and a plurality of voltage-switching devices, at least one voltage-switching device for receiving a respective bit line address selection signal, each voltage-switching device comprising a high-voltage translator circuit connected to a high-voltage node receiving either a low-voltage logic level or a high-voltage level as a function of a low-voltage/high-voltage mode control signal, said high-voltage translator providing at least one output signal as a function of the low-voltage/high-voltage mode control signal and the bit line address selection signal, and a voltage-level switching circuit connected to said high-voltage translator circuit and being controlled by the at least one output signal, the low-voltage/high-voltage mode control signal, and the bit line address selection signal for providing one of the plurality of switching signals, as an output voltage level, that is ground or the low-voltage logic level for the low-voltage mode, and the high-voltage level for the high-voltage mode.

13. A non-volatile memory according to claim 12, wherein said plurality of switching transistors comprises a plurality of PMOS and NMOS switching transistors; and wherein said at least one voltage-switching device receiving a respective bit line address selection signal comprises:

a first voltage-switching device receiving the respective bit line address selection signal, and providing a first switching signal to a respective PMOS transistor for control thereof; and a second voltage-switching device receiving an inverse of the respective bit line address selection signal, and providing a second switching signal to a respective NMOS transistor for control thereof.

14. A non-volatile memory according to claim 12, wherein a first level of the low-voltage/high-voltage mode control signal corresponds to a read mode, and the output voltage level of each voltage-switching device is ground or the low-voltage logic level depending on the bit line address selection signal applied at input.

15. A non-volatile memory according to claim 14, wherein a second level of the low-voltage/high-voltage mode control signal corresponds to a write mode, and the output voltage level of each voltage-switching device is the low-voltage logic level or the high-voltage level depending on the bit line address selection signal applied at input.

16. A non-volatile memory according to claim 12, wherein each high-voltage translator circuit comprises two switching arms, each switching arm being connected between the high-voltage node and a respective source node; and further comprising a respective control circuit associated with each source node for providing the bit line address selection signal or an inverse thereof as a function of the low-voltage/high-voltage mode control signal.

17. A non-volatile memory according to claim 16, wherein the at least one output signal from said high-voltage translator circuit includes a first output signal provided by one of the switching arms, and a second output signal provided by the other switching arm.

18. A non-volatile memory according to claim 12, wherein each voltage-level switching circuit comprises a respective switching circuit portion for each output voltage level to be switched.

19. A non-volatile memory according to claim 18, further comprising a logic circuit for receiving the low-voltage/high-voltage mode control signal and the bit line address selection signal or an inverse thereof; and wherein said respective switching circuit portion comprises a first switching circuit portion comprising an NMOS transistor connected between an output line providing the output voltage level, and an output of said logic circuit for switching the output line to ground.

20. A non-volatile memory according to claim 18, wherein the at least one output signal from said high-voltage translator circuit includes a first output signal; wherein said respective switching circuit portion comprises a second switching circuit comprising first and second PMOS transistors series-connected between the low-voltage logic level and an output line providing the output voltage level; and wherein each of said first and second PMOS transistors comprises a gate connected in common and being controlled by the first output signal for switching the low-voltage logic level to the output line.

21. A non-volatile memory according to claim 18, further comprising a logic circuit for receiving the low-voltage/high-voltage mode control signal and the bit line address selection signal or an inverse thereof; wherein said second switching circuit portion further comprises a pair of protection transistors; and wherein said pair of protection transistors comprises a third PMOS transistor and a first NMOS transistor series-connected between the low voltage logic level and ground, said third PMOS transistor comprising a gate being controlled by the read/write control signal, and said first NMOS transistor comprising a gate being controlled by an output of said logic circuit.

22. A non-volatile memory according to claim 18, wherein the at least one output signal from said high-voltage translator circuit includes a first and a second output signal; wherein said respective switching circuit portion comprises a third switching circuit portion comprising first and second PMOS transistors series-connected between the high-voltage node and an output line providing the output voltage level; and wherein said first PMOS transistor comprises a gate being controlled by the second output signal, and said second PMOS transistor comprising a gate being biased by the low-voltage logic level.

23. A non-volatile memory according to claim 22, wherein said third switching circuit portion comprises a third PMOS transistor connected between the low-voltage logic level and a connection point between said first and second PMOS transistors; and wherein said third PMOS transistor comprises a gate being controlled by the first output signal.

24. A non-volatile memory according to claim 12, wherein the low-voltage logic level is less than or equal to 2.5 volts.

25. A method for controlling a voltage-switching device comprising a high-voltage translator connected to a high-voltage node, and a voltage-level switching circuit connected to the high-voltage translator circuit for providing an output voltage level, the method comprising:

providing to the high-voltage node a low-voltage logic level or a high-voltage level as a function of a low-voltage/high-voltage mode control signal;

generating at least one output signal from the high-voltage translator as a function of the low-voltage/high-voltage mode control signal and a switching control signal; and controlling the voltage-level switching circuit by the at least one output signal, the low-voltage/high-voltage mode control signal and the switching control signal for generating, as the output voltage level, ground or the low-voltage logic level for the low-voltage mode, and the high-voltage level for the high-voltage mode.

26. A method according to claim 25, wherein the high-voltage translator circuit comprises two switching arms, each switching arm being connected between the high-voltage node and a respective source node; the voltage-switching device further comprising a respective control circuit associated with each source node; the method further comprising:

providing the switching control signal or an inverse thereof to each respective source node as a function of the mode control signal.

27. A method according to claim 26, wherein the at least one output signal from the high-voltage translator circuit includes a first output signal provided by one of the switching arms, and a second output signal provided by the other switching arm.

28. A method according to claim 25, wherein the voltage-level switching circuit comprises a respective switching circuit portion for each output voltage level to be switched.

29. A method according to claim 28, wherein the voltage-switching device further comprises a logic circuit for receiving the low-voltage/high-voltage mode control signal and the switching control signal or an inverse thereof; and wherein the respective switching circuit portion comprises a first switching circuit portion comprising an NMOS transistor connected between an output line providing the output voltage level, and an output of the logic circuit for switching the output line to ground.

30. A method according to claim 28, wherein the at least one output signal from the high-voltage translator circuit includes a first output signal; wherein the respective switching circuit portion comprises a second switching circuit comprising first and second PMOS transistors series-connected between the low-voltage logic level and an output line providing the output voltage level; and wherein each of the first and second PMOS transistors comprises a gate connected in common and being controlled by the first output signal for switching the low-voltage logic level to the output line.

31. A method according to claim 28, further comprising a logic circuit for receiving the low-voltage/high-voltage mode control signal, and the switching control signal or an inverse thereof; wherein the second switching circuit portion further comprises a pair of protection transistors; and wherein the pair of protection transistors comprises a third PMOS transistor and a first NMOS transistor series-connected between the low voltage logic level and ground, the third PMOS transistor comprising a gate being controlled by the low-voltage/high-voltage mode control signal, and the first NMOS transistor comprising a gate being controlled by an output of the logic circuit.

32. A method according to claim 28, wherein the at least one output signal from the high-voltage translator circuit includes a first and a second output signal; and the respective switching circuit portion comprises a third switching circuit portion comprising first and second PMOS transistors series-connected between the high-voltage node and an output line providing the output voltage level; and wherein the first PMOS transistor comprises a gate being controlled by the second output signal, and the second PMOS transistor comprises a gate being biased by the low-voltage logic level.

33. A method according to claim 32, wherein the third switching circuit portion comprises a third PMOS transistor connected between the low-voltage logic level and a connection point between the first and second PMOS transistors; and wherein the third PMOS transistor comprises a gate being controlled by the first output signal.

34. A method according to claim 25, wherein the output voltage level from the voltage-level switching circuit is for controlling a gate of a MOS transistor connected thereto.

35. A method according to claim 25, wherein the low-voltage logic level is less than or equal to 2.5 volts.

* * * * *